United States Patent
Espalieu et al.

(10) Patent No.: US 8,446,155 B2
(45) Date of Patent: May 21, 2013

(54) ANALOG CIRCUIT TEST DEVICE

(75) Inventors: Florian Espalieu, Grenoble (FR); Paul Giletti, Nyons (FR); Frédéric Poullet, Vizille (FR)

(73) Assignee: Dolphin Integration, Meylan (FR)

( * ) Notice: Subject to any disclaimer, the term of this patent is extended or adjusted under 35 U.S.C. 154(b) by 569 days.

(21) Appl. No.: 12/672,612

(22) PCT Filed: Aug. 5, 2008

(86) PCT No.: PCT/FR2008/051460
§ 371 (c)(1),
(2), (4) Date: Mar. 23, 2010

(87) PCT Pub. No.: WO2009/024717
PCT Pub. Date: Feb. 26, 2009

(65) Prior Publication Data
US 2012/0126824 A1    May 24, 2012

(30) Foreign Application Priority Data
Aug. 10, 2007  (FR) ...................................... 07 57037

(51) Int. Cl.
*G01R 29/26*  (2006.01)
(52) U.S. Cl.
USPC ............................. 324/614; 324/601; 324/613
(58) Field of Classification Search
USPC ........................................................ 324/601
See application file for complete search history.

(56) References Cited

U.S. PATENT DOCUMENTS

| | | | |
|---|---|---|---|
| 5,668,507 | A | 9/1997 | Boerstler |
| 2002/0120898 | A1 | 8/2002 | Chen |

OTHER PUBLICATIONS

Gauss Law—Colorado University physics text—p. 1-10.*
Gaussian Law of Gravity—Prince Georges Community College, Simpson, 2006, p. 1-5.*
Danger et al., Efficient FPGA implementation of Gaussian noise generator for communciation channel emulation, IEEE 0-7803-6542-0/00, 2000, p. 366-369.*
Matsumoto—JP2007-140762, JPO Machine Translation, p. 1-16.*
"Efficient fpga implementation of guaussian noise generator for communication channel emulation", J.L. Danger, et al., Electronics, Circuits and Systems, 2000. ICES 2000. The 7th IEEE International Conference on Dec. 17-20, 2000. Piscataway, NJ, USA, IEEE vol. 1, Dec. 17, 2000, pp. 366-369, XP010535726, ISBN: 0-7803-6542-9.
International Search Report issued in PCT/FR2008/051460 issued on Mar. 13, 2009.
"International Preliminary Report on Patentability" and "Written Opinion" issued Apr. 7, 2010 by the International Bureau regarding PCT/FR2008/051460.

* cited by examiner

Primary Examiner — Thomas Valone
(74) Attorney, Agent, or Firm — Vedder Price PC

(57) ABSTRACT

The invention relates to a test device for an analog circuit to be mounted on a mixed circuit including said analog circuit and a synchronous digital circuit. The test device includes a disturbance emulator connected to a first supply source (UrefD) capable of disturbing a second supply source (UrefA) of the analog circuit, the first and second supply sources being optionally merged, the emulator being adapted for receiving data representative of the evolution, during a given duration, of the average ($\mu I$) and the typical deviation ($\sigma I$) of a first inrush current (I) that would be applied to the first supply source by the digital circuit, and being adapted for applying to the first supply source during successive intervals, each successive interval having said duration, a second inrush current ($I_{rep}$) equal to the sum of the average and of the product of the typical deviation and of a pseudo-random signal varying according to a Gaussian law.

9 Claims, 4 Drawing Sheets

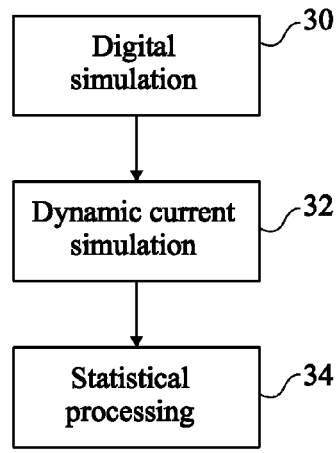
Fig 6
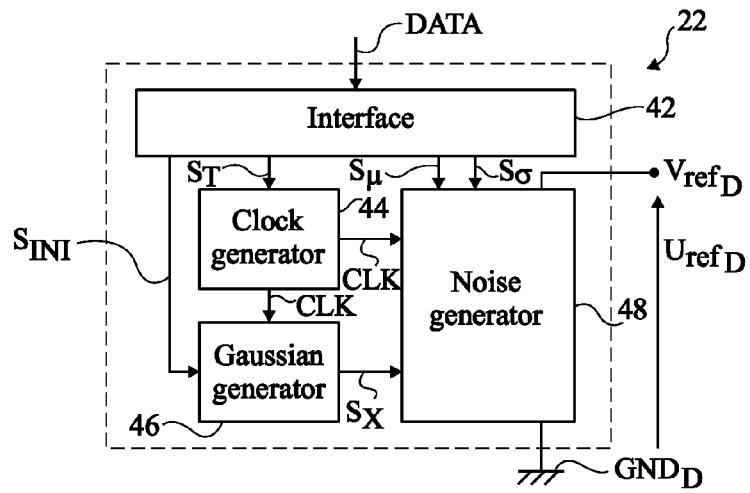
Fig 7
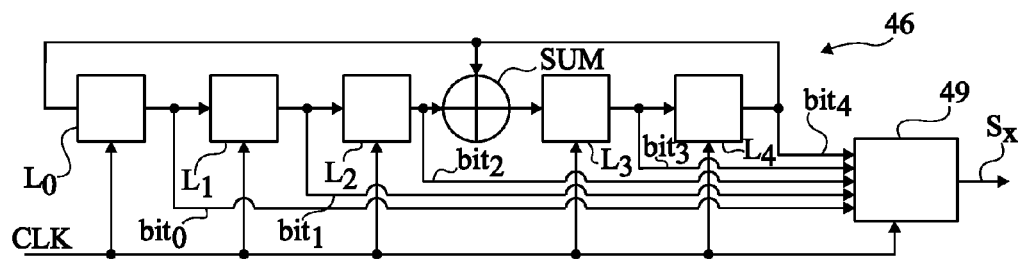
Fig 8
Fig 9

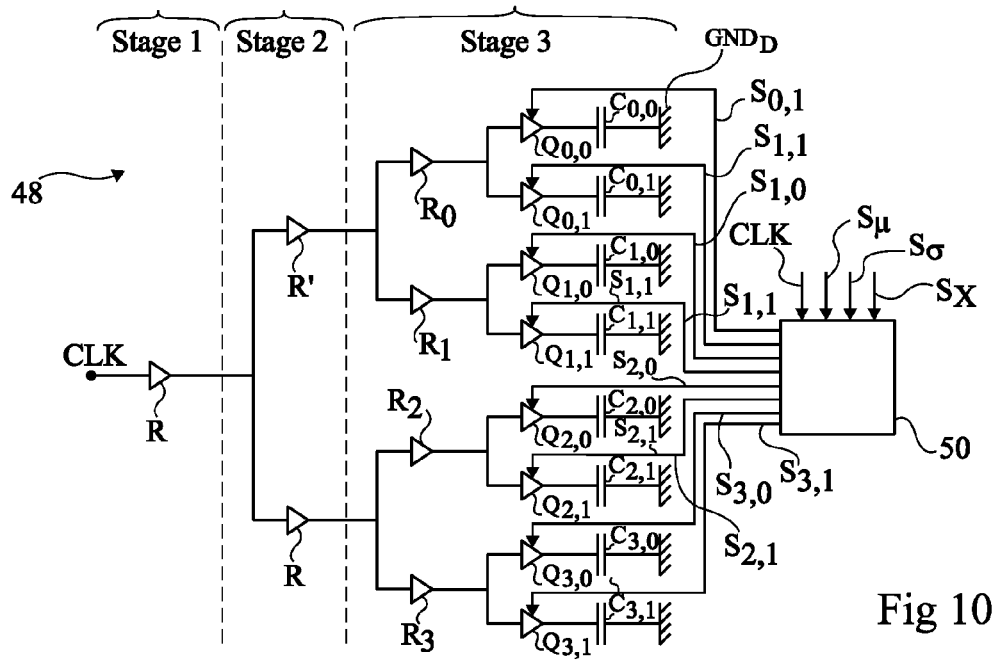
Fig 10
Fig 11
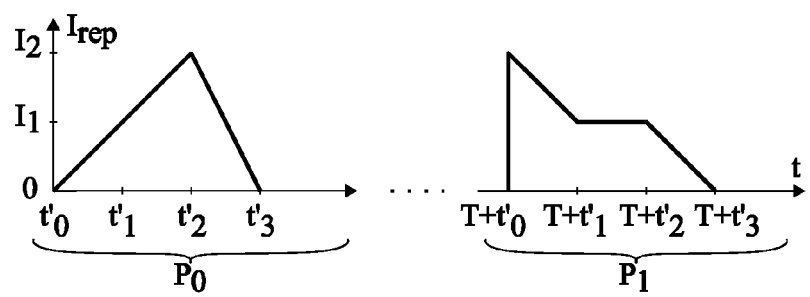
Fig 12

ANALOG CIRCUIT TEST DEVICE

FIELD OF THE INVENTION

The present invention relates to a method and a device for testing an analog circuit of a circuit having digital and analog parts.

DISCUSSION OF PRIOR ART

A combined digital/analog circuit comprises analog components and logic (or digital) components which can be connected to a same power source or to different power sources which corrupt one another with noise through various parasitic elements, such as resistors, capacitors, or inductances.

FIG. 1 schematically shows a combined electronic circuit 10 comprising analog components, forming a circuit 12 (A), called analog circuit. Circuit 12 may correspond to amplifiers, analog filters, analog-to-analog, analog-to-digital or digital-to-analog converters, oscillators, etc. Circuit 10 also comprises logic components, for example, logic gates, flip-flops, etc. forming a circuit 14 (D) called logic circuit or digital circuit. The power supply of the components of analog circuit 12 is obtained by connecting circuit 12 to a source of a first reference potential $Vref_A$ and to a source of a second reference potential, for example, ground $GND_A$ of the analog circuit. Voltage $Uref_A$, which corresponds to the difference between the first and second reference potentials, is called the power supply voltage of the analog circuit. The power supply of the components of digital circuit 14 is obtained by connecting circuit 14 to a source of a third reference potential $Vref_D$ and to a source of a fourth reference potential, for example, ground $GND_D$ of the digital circuit. Voltage $Uref_D$, which corresponds to the difference between the third and fourth reference potentials, is called the power supply voltage of the digital circuit.

In most cases, digital circuit 14 operates synchronously, that is, it operates at the rate of one or several clock signals which time the operation of logic components such as flip-flops. Thereby, during the operation of digital circuit 14, many simultaneous or nearly simultaneous switchings of the signals used by the logic components can be observed. Such simultaneous or nearly simultaneous switchings translate as significant current surges on the side of the power supply of digital circuit 14. This translates as noise on the side of analog circuit 12, especially as to the power supply of analog circuit 12, the potential distribution in the substrate of analog circuit 12, etc. As an example, temporary variations of power supply voltage $Uref_A$ can be observed. Such noise on the side of analog circuit 12 causes a degradation of the performances of analog circuit 12.

Generally, in the development of electronic circuit 10, analog circuit 12 is tested independently from digital circuit 14, especially to determine its performance. However, in such a test, the noise affecting analog circuit 12, especially the variations of power supply voltage $Uref_A$ of analog circuit 12 due to the operation of digital circuit 14, is not taken into account. The performance degradation of analog circuit 12, which result from the joint use of analog and digital circuits 12 and 14 thus cannot be determined.

To take into account the noise in analog circuit 12, especially the variation of power supply voltage $Uref_A$ of analog circuit 12 due to the operation of digital circuit 14, a possibility is to form a test device comprising analog circuit 12 to be tested and digital circuit 14. However, since the structure of digital circuit 14 may greatly vary during the development process of electronic circuit 10, it is necessary to construct a new test circuit for each possible variation of digital circuit 14, which is too expensive.

It is thus desired to test analog circuit 12, rather than with digital circuit 14, with a circuit having a much simpler structure simulating the noise of power supply voltage $Uref_D$ which would be observed in the operation of digital circuit 14.

FIG. 2 shows a test device 20 comprising analog circuit 12 and an emulator 22 intended to reproduce, at least partially, the noise of power supply voltage $Uref_D$ due to digital circuit 14.

Emulator 22 must meet several requirements. It must be as simple as possible so that the manufacturing cost of test circuit 20 is as low as possible. It must however reproduce the noise of power supply voltage $Uref_D$ due to digital circuit 14 with a sufficient accuracy so that the test provides pertinent data relative to the performance decrease of analog circuit 12. Finally, a same emulator 22 must, after reprogramming, be able to reproduce the noise due to different digital circuits 14, to avoid having to design a test device 20 for each digital circuit 14 with which analog circuit 12 is capable of being used.

SUMMARY OF THE INVENTION

The present invention aims at a method and at a device for testing an analog circuit intended to operate jointly with a synchronous digital circuit.

According to another object, the test device has a relatively simple design.

According to another object, the test device enables to reproduce noise of the power supply voltage close to that which would be observed during the operation of the digital circuit.

According to another object, the test device enables to easily test an analog circuit intended to be used with different digital circuits.

The present invention thus provides a device for testing an analog circuit, for a combined circuit comprising this analog circuit and a synchronous digital circuit, said test device comprising a noise emulator connected to a first power supply source capable of disturbing a second power supply source of the analog circuit, where the first and second power supply sources may be a single supply source, the emulator being capable of receiving data representative of the variation, over a given time period, of the average and of the standard deviation of a first surge current which would be applied to the first power supply source by the digital circuit, and being capable of applying to the first power supply source, over successive intervals, each successive interval having the duration of said time period, a second surge current equal to the sum of the average and of the product of the standard deviation and of a pseudo-random signal varying according to a Gaussian law.

According to an embodiment of the present invention, the device comprises at least one circuit for providing the pseudo-random signal capable of providing a new value of the pseudo-random signal for each successive interval; and a noise generation circuit capable of applying the second surge current to the first power supply source.

According to an embodiment of the present invention, the noise generation circuit comprises a processing unit receiving the pseudo-random signal and the representative data and providing control signals; and noise elements, each noise element being connected to the first power supply source and being capable of being controlled by one of the control signals to provide an elementary surge current.

According to an embodiment of the present invention, the noise generation circuit comprises a first stage comprising a transmission element receiving a clock signal; second successive stages each comprising several groups of at least one transmission element, the input of said at least one transmission element of each group being connected to the output of the transmission element or of one of the transmission elements of the previous stage; and a last stage comprising a first plurality of transmission elements, the input of each of the first plurality of transmission elements being connected to one of the transmission elements of the previous stage and the output of each of the first plurality of transmission elements being connected to a second plurality of transmission elements.

According to an embodiment of the present invention, each noise element comprises a switching element, receiving one of the control signals, in series with a capacitor, the switching element being capable of being on or off according to the control signal.

According to an embodiment of the present invention, each of the first plurality of transmission elements has a transmission duration which depends on the transmission element.

According to an embodiment of the present invention, the device further comprises a circuit for providing a clock signal to the circuit for providing the pseudo-random signal and to the noise generation circuit.

The present invention also provides a method for testing an analog circuit for a combined circuit comprising this analog circuit and a synchronous digital circuit, comprising the steps of:

providing a test device or a test device simulation comprising or simulating the analog circuit and a noise emulator connected to a first power supply source capable of disturbing a second power supply source of the analog circuit, where first and second power supply sources may be a single supply source;

providing the emulator with data representative of the variation, over a given time period, of the average and of the standard deviation of a first surge current which would be applied to the first power supply source by the digital circuit; and having the emulator apply or simulate the fact of applying to the first power supply source, over successive intervals, each interval having the duration of said time period, a second surge current equal to the sum of the average and of the product of the standard deviation and of a pseudo-random signal varying according to a Gaussian law.

According to an embodiment of the present invention, the provision of said representative data comprises the steps of:

estimating the variation of the first surge current over several successive intervals each having said duration; and determining, for each first time among first successive times of an interval having said duration, the average of the values of the first surge current at second times, each second time being equal to the first time modulo said duration, and the standard deviation of the values of the first surge current at said second times.

BRIEF DESCRIPTION OF THE DRAWINGS

The foregoing objects, features, and advantages of the present invention, as well as others, will be discussed in detail in the following non-limiting description of specific embodiments in connection with the accompanying drawings, among which:

FIG. 6 shows, in the form of a block diagram, an example of a method for determining statistical characteristics of the surge current of a digital circuit;

FIG. 7 shows an embodiment of a noise emulator according to the invention;

FIG. 8 schematically shows an embodiment of a portion of the emulator of FIG. 7;

FIG. 9 illustrates the operation of the emulator portion of FIG. 8;

FIG. 10 shows an embodiment of another portion of the emulator of FIG. 7;

FIGS. 11 and 12 illustrate the operating principle of the emulator portion of FIG. 10.

DETAILED DESCRIPTION

Figure 1:
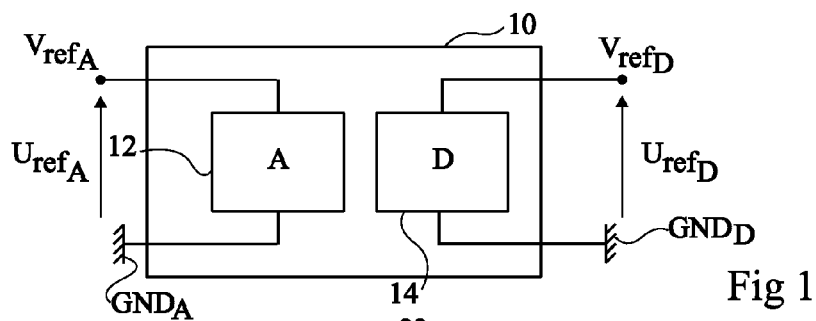
FIG. 1, previously described, schematically shows a digital/analog electronic circuit.
Figure 2:
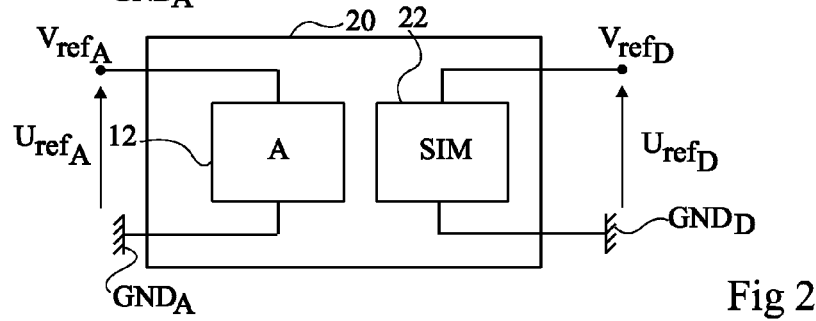
FIG. 2, previously described, schematically shows a device for testing an analog circuit.

For clarity, the same elements have been designated with the same reference numerals in the different drawings.

The applicant has set about constructing a noise emulator having a relatively simple structure and enabling, in operation, to reproduce the surge current peaks resulting from the operation of a conventional digital circuit. First, the applicant has envisaged the possibility of using a digital circuit emulator enabling to obtain surge current peaks distributed randomly along time. However, the applicant has shown that during the test of an analog circuit with such an emulator, the obtained performance decrease is not representative of the effective performance decrease observed when the analog circuit operates with the digital circuit. The applicant has then further examined the variation of the surge current observed during the operation of a conventional digital circuit.

Figure 3:
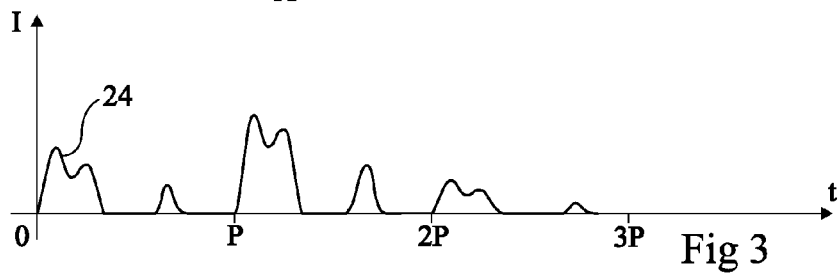
FIG. 3 shows an example of the variation of the surge current in the operation of a digital circuit.

FIG. 3 shows an example of the variation of surge current I during the operation of a synchronous digital circuit rated by a clock signal of period P. The applicant has shown that, for most synchronous digital circuits, the variation curve of surge current I has remarkable statistical characteristics. Indeed, the variation curve of surge current I comprises surge current peaks 24 which are not randomly distributed along time but which occur substantially at the same times for each clock cycle or group of clock cycles. However, the amplitude of the current peaks generally varies from one clock cycle to the other or from one group of clock cycles to another.

The applicant has shown that it is sufficient to design a noise emulator which, in operation, enables to obtain a surge current $I_{rep}$ reproducing a number of statistical characteristics of the surge current I which would be observed with the digital circuit. More specifically, the applicant has shown that it is sufficient for the reproduced surge current $I_{rep}$ to have the same average and the same standard deviation as the surge current I which would be observed with the digital circuit. The testing of an analog circuit with the noise emulator then enables to determine a performance decrease representative of the performance decrease effectively observed when the analog circuit operates jointly with the digital circuit.

To achieve this, it is sufficient for the noise emulator to enable to obtain a reproduced surge current $I_{rep}$ according to the following relation:

$$I_{rep}(t) = \mu_I(t[T]) + \sigma_I(t[T]) * X(t) \quad (1)$$

where T is a reference duration, for example, equal to the clock period of the digital circuit or to a multiple of the clock period;

t[T] means t modulo T;

$\mu_I$ corresponds to the average of surge current I over interval [0, T];

$\sigma_I$ corresponds to the standard deviation of the surge current over interval [0, T]; and X is a random function obeying a normal distribution. Function X is constant over each interval [kT, (k+1)T], where k is an integer greater than or equal to zero.

When the variation curve of surge current I associated with a digital circuit is known for a duration equal to N*T, average $\mu_I$ may be obtained from the following relation, for t ranging within [0, T]:

$$\mu_I(t) = \frac{1}{N} \sum_{k=0}^{k=N} I(t + kT) \quad (2)$$

and standard deviation $\sigma_I$ may be obtained from the following relation, for t ranging within [0, T]:

$$\sigma_I(t) = \sqrt{\frac{1}{N} \sum_{k=0}^{k=N} (I(t + kT) - \mu_I(t))^2} \quad (3)$$

Figure 4:
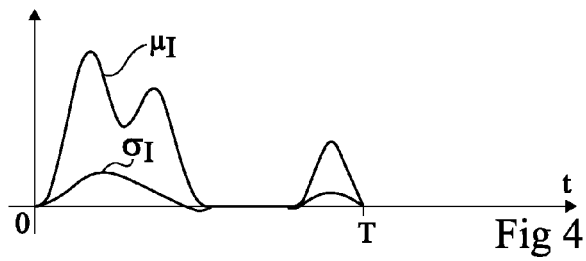
FIG. 4 shows an example of the variation of the average and of the standard deviation of the surge current in the operation of a digital circuit.

FIG. 4 shows examples of variation curves of average $\mu_I$ and of standard deviation $\sigma_I$ obtained from the variation curve of surge current I shown in FIG. 3.

Figure 5:
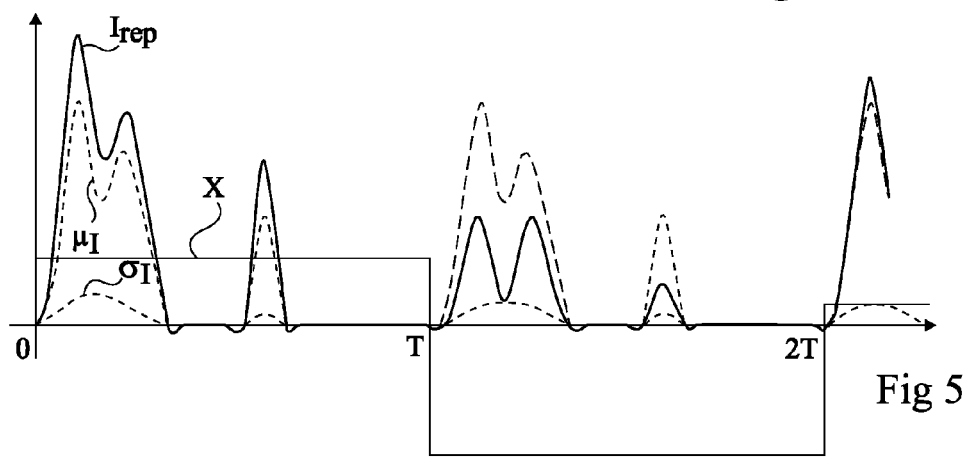
FIG. 5 illustrates the principle of surge current reproduction.

FIG. 5 illustrates the principle of the determination of the reproduced surge current $I_{rep}$ based on relation (1) and shows, in dotted lines, the variation curves of average $\mu_I$ and of standard deviation $\sigma_I$ which are produced for each successive time interval of duration T, in thin lines, function X and, in thick lines, the obtained variation curve of reproduced current $I_{rep}$.

FIG. 6 shows, in the form of a block diagram, an example of a method for determining average $\mu_I$ and standard deviation $\sigma_I$ of the surge current associated with digital circuit 14, such statistical characteristics being then provided to emulator 22 to test analog circuit 12.

Step 30 gathers all the steps generally implemented in the design of digital circuit 14. As an example, the design of digital circuit 14 comprises:

a specification determination step comprising, for example, dividing digital circuit 14 into different functional blocks;

a step of description of the behavior of each functional block in a hardware description language (HDL), for example, VHDL or Verilog;

a step of simulation of the behavioral description, for example implemented by means of the SMASH software sold by Dolphin Integration;

a generally-called "Synthesis" step which comprises providing, based on the HDL behavioral description, a file called Netlist, for example, in Verilog language, which corresponds to a list of interconnections of logic gates of a library;

a step of simulation after synthesis of the Netlist file, for example implemented by means of the SMASH software sold by Dolphin Integration;

a generally-called "placing and routing" step which comprises, based on the Netlist file, determining a concrete representation of digital circuit 14 where the positions of the logic components and of the tracks connecting them are specified. The result of the "placing and routing" step is a geometric description of digital circuit 14, called Layout, for example in format GDS2. It is also possible to provide a so-called delay file, for example, in SDF format, which contains the delays of the gates and interconnections. Further, the placing and routing step may cause a modification of the Netlist file, for example, when a clock tree must be provided. A new Netlist file, for example, in Verilog language, is then provided; and a step of simulation of the modified Netlist file taking the delays into account, for example, implemented by means of the SMASH software sold by Dolphin Integration.

At step 32, digital circuit 14 is simulated based on the modified Netlist file and on the delay file, to determine an estimate of the variation of surge current I resulting from the operation of digital circuit 14. Such a simulation may be implemented with the SMASH software sold by Dolphin Integration. Such a simulation is generally reserved to analog circuits. The result of step 32 is the obtaining of files, for example, in DAT format, representative of the variation of surge current I along time.

At step 34, a statistic processing of the files obtained at the previous step is carried out to determine functions $\mu_I$ and $\sigma_I$. For this purpose, the variation curve of surge current I is divided into N intervals of duration T, where duration T may correspond to the period of the clock signal of the digital circuit or to a multiple of this period. Over time interval [0, T], M successive times $t_i$ are defined, i being an integer ranging between 0 and M−1, and times $t_i$ ranging between 0 and T. Average $\mu_I$ and standard deviation $\sigma_I$ are determined at times $t_i$ based on relations (2) and (3) as follows:

$$\mu_I(t_i) = \frac{1}{N} \sum_{k=0}^{k=N} I(t_i + kT) \quad (4)$$

$$\sigma_I(t_i) = \sqrt{\frac{1}{N} \sum_{k=0}^{k=N} (I(t_i + kT) - \mu_I(t_i))^2} \quad (5)$$

FIG. 7 shows an embodiment of a noise emulator 22 according to the invention. Emulator 22 comprises an interface circuit 42 capable of receiving data DATA. Interface circuit 42 provides a clock period reference $S_T$ to a circuit 44 capable of providing a clock signal CLK. To simplify the rest of the description, it is considered that duration T corresponds to the period of clock signal CLK. Interface 42 provides an initialization reference $S_{INI}$ to a circuit 46 receiving clock signal CLK and providing a signal $S_X$. Further, interface circuit 42 provides signals $S_\mu$ and $S_\sigma$ to a noise generation circuit 48 connected to reference voltage source $Vref_D$ and to ground $GND_D$. Noise generation circuit 48 also receives clock signal CLK and signal $S_X$.

Interface circuit 42 for example comprises a shift register, data DATA being provided in series to the register.

Data DATA comprise signals $S_\mu$ and $S_\sigma$, clock period reference $S_T$, and initialization reference $S_{INI}$. Signal $S_\mu$ is representative of average $\mu_I$ and signal $S_\sigma$ is representative of standard deviation $\sigma_I$. Signals $S_\mu$ and $S_\sigma$ are not necessarily identical to data $\mu_I$ and $\sigma_I$ obtained at step 34 of the previously-described method. Indeed, a prior processing of data $\mu_I$ and $\sigma_I$ may be provided before their transmission to interface circuit 42.

Circuit 44 for providing clock signal CLK for example has the structure of a ring oscillator. Signal CLK for example corresponds to a periodic square signal of duty cycle ½, having its period depending on reference $S_T$. As an example, circuit 44 may comprise an inverter having its output looped back on its input, with a propagation time that may be modified according to reference $S_T$.

According to a variation, circuit 44 for providing clock signal CLK is not integrated to emulator 22. Clock signal CLK used by emulator 22 is then provided by a device external to emulator 22.

Circuit 46 provides signal $S_X$ which is representative of random value X obeying a reduced centered Gaussian distribution. Circuit 46 is capable of providing a new value of signal $S_X$ for each clock cycle CLK.

FIG. 8 shows a simplified embodiment of circuit 46. Circuit 46 comprises a succession of five flip-flops $L_0$ to $L_4$, each receiving clock signal CLK. Each flip-flop $L_0$ to $L_4$ delivers a bit $bit_0$ to $bit_4$. A processing unit 49 receives bits $bit_0$ to $bit_4$ and clock signal CLK and provides signal $S_X$. The output of flip-flop $L_0$ drives the input of flip-flop $L_1$. The output of flip-flop $L_1$ drives the input of flip-flop $L_2$. The output of flip-flop $L_2$ drives a first input of an adder SUM. The output of adder SUM drives flip-flop $L_3$. The output of flip-flop $L_3$ drives the input of flip-flop $L_4$. The output of flip-flop $L_4$ drives the input of flip-flop $L_0$ and a second input of adder SUM. Adder SUM for example corresponds to an XOR-type logic gate. The position of adder SUM may be modified with respect to what is shown in FIG. 8.

The operation of circuit 46 is the following: the initial values of bits $bit_0$ to $bit_4$ are imposed by reference $S_{INI}$ provided by interface circuit 42. In operation, for each rising edge of clock signal CLK, each flip-flop $L_0$ to $L_4$ reproduces at its output the binary value present at its input during the previous period of the clock signal. A new series of bits $bit_0$ to $bit_4$ is thus obtained for each clock cycle CLK.

FIG. 9 shows an example of the variation of bits $bit_0$ to $bit_4$ for five successive cycles of clock signal CLK. Calling Y the sum of bits $bit_0$ to $bit_4$, it can be shown that Y corresponds to a pseudo-random value which is all the closer to a Gaussian distribution of average $\mu_Y$ and of standard deviation $\sigma_Y$ as the chain of flip-flops $L_0$ to $L_4$ is long. In practice, circuit 46 comprises a number of flip-flops that may be greater than 30. Random value X following a reduced centered Gaussian distribution may be equal to the ratio between value Y, minus $\mu_Y$, and $\sigma_Y$. The signal $S_X$ provided by processing unit 49 is equal to X. As an example, signal $S_X$ is coded over 32 bits. In practice, the number of flip-flops of circuit 46 may be equal to the number of bits of signal $S_X$. According to a variation, processing unit 49 is not present at the level of circuit 46 and the bits of signal $S_X$ correspond to bits $bit_0$ to $bit_4$. Value X may then be determined at the level of noise generation circuit 48 or at the level of an intermediary circuit between circuit 46 and circuit 48.

FIG. 10 shows an embodiment of noise generation circuit 48. Circuit 48 for example has a structure similar to that of a clock tree. A clock tree enables to transmit the clock signal to the different logic components of a digital circuit and generally comprises several successive stages of inverters or of amplifiers (an amplifier corresponding to two series-assembled inverters). As an example, the first stage comprises an amplifier receiving the clock signal. The second stage comprises several amplifiers having their inputs connected to the output of the amplifier of the first stage. The next stages each comprise several groups of amplifiers, the inputs of the amplifiers of a same group being connected to the output of one of the amplifiers of the previous stage. The last stage of the clock tree comprises several groups of amplifiers, the inputs of the amplifiers of a same group being connected to the output of one of the amplifiers of the previous stage and the output of each amplifier being connected to a logic component of the digital circuit, generally a flip-flop.

As an example, in FIG. 10, a noise generation circuit 48 based on the structure of a three-stages clock tree, with a first stage comprising an amplifier R receiving clock signal CLK and a second stage comprising two amplifiers R' having their inputs connected to the output of amplifier R has been shown. The last stage of circuit 48 comprises a number M, equal to 4 in FIG. 10, of amplifiers $R_i$, with i ranging between 0 and M−1. The inputs of amplifiers $R_i$ are connected to the output of one of amplifiers R' of the previous stage. The output of each amplifier $R_i$ is connected to a number L, equal to 2 in FIG. 10, of switchable amplifiers $Q_{i,j}$, with j ranging between 0 and L−1. The output of each amplifier $Q_{i,j}$ is connected to a terminal of a capacitor $C_{i,j}$ having its other terminal connected to ground $GND_D$ or to reference potential $Vref_D$. Amplifiers $Q_{i,j}$ have an identical propagation delay.

As described previously, number M corresponds to the number of times $t_i$, with i ranging between 0 and M−1, in interval [0, T] for which average $\mu_I$ and standard deviation $\sigma_I$ have been determined. With each amplifier $R_i$, with i ranging between 0 and M−1, is associated a propagation time $\Delta_i$ corresponding to the time required for a signal received at the input of amplifier $R_i$ to be provided at the output of amplifier $R_i$. Clock signal CLK which propagates in the first stages of circuit 48 arrives substantially simultaneously at the level of amplifiers $R_i$. Clock signal CLK then reaches amplifiers $Q_{i,j}$, with j ranging between 0 and L−1, after a delay $\Delta_i$. Amplifiers $R_i$ have propagation times which differ from one another so that the difference between $\Delta_i$ and $\Delta_{i-1}$, with i ranging between 1 and M−1, is equal to the difference between $t_i$ and $t_{i-1}$. Amplifiers $Q_{i,j}$ having the same propagation time, clock signal CLK reaches capacitors $C_{i,j}$ according to the same sequence as times $t_i$. In the present example illustrated in FIG. 10, considering that clock signal CLK reaches capacitors $C_{0,0}$ and $C_{0,1}$ at a time $t'_0$, the same clock signal CLK reaches capacitors $C_{1,0}$ and $C_{1,1}$ at a time $t'_1$, capacitors $C_{2,0}$ and $C_{2,1}$ at a time $t'_2$, and capacitors $C_{3,0}$ and $C_{3,1}$ at a time $t'_3$, with times $t'_0, t'_1, t'_2$, and $t'_3$ following one another according to the same sequence as respective times $t_0, t_1, t_2$, and $t_3$.

Each amplifier $Q_{i,j}$ is controlled by a control signal $S_{i,j}$ and may be on or off according to the value of signal $S_{i,j}$. Control signals $S_{i,j}$ are provided by a processing unit 50 receiving signals CLK, $S_\mu$, $S_\sigma$, and $S_X$. When off, amplifier $Q_{i,j}$ does not transmit clock signal CLK received at its input. When on, amplifier $Q_{i,j}$ transmits the clock signal received at its input with a propagation time which is identical for all amplifiers $Q_{i,j}$.

Capacitors $C_{i,j}$ are identical. As an example, the capacitance of each capacitor $C_{i,j}$ is on the order of 100 fF. The application of a rising edge of clock signal CLK across a capacitor $C_{i,j}$ translates as a current surge propagating to reference voltage source $Vref_D$, which is connected to each of amplifiers R, R', $R_i$, and $Q_{i,j}$. Thereby, at a given time, the amplitude of the surge current of circuit 48 depends on the number of capacitors which are simultaneously being charged. Number L corresponds to the accuracy with which the amplitude of the surge current may be obtained. Indeed, as will be described in further detail hereafter, circuit 48 can provide a surge current that can substantially take L+1 values.

Initially, processing unit 50 receives signals $S_\mu$, $S_\sigma$. For each new clock cycle, processing unit 50 receives a new value of signal $S_X$ and determines the reproduced surge current $I_{rep}$ to be obtained from relation (1) during a clock cycle. It then determines the control signals $S_{i,j}$ to be provided so that, all along the clock cycle, the number of capacitors $C_{i,j}$ being simultaneously charged or discharged at a given time enables to obtain the desired value of the surge current at this time. Control signals $S_{i,j}$ may be determined from a look-up table or a calculation algorithm. Control signals $S_{i,j}$ may be simultaneously sent to all amplifiers $Q_{i,j}$, or successively sent to amplifiers $Q_{i,j}$ during a clock cycle. Further, the control signals $S_{i,j}$ determined during a clock cycle may be transmitted to amplifiers $Q_{i,j}$ during the next clock cycle.

FIG. 11 schematically shows an example of a variation curve of the reproduced surge current $I_{rep}$ likely to be obtained with circuit 48 of FIG. 10. Two successive clock cycles $P_0$, $P_1$ in the operation of circuit 48 have been shown.

FIG. 12 shows, for cycles $P_0$, $P_1$, the values of control signals $S_{i,j}$ provided by processing unit 50 and enabling to obtain the surge current of FIG. 11. It is assumed that a control signal $S_{i,j}$ is at state "0" when the corresponding amplifier $Q_{i,j}$ is off and is at state "1" when the corresponding amplifier $Q_{i,j}$ is on. To simplify the description of the operation of circuit 48, only the currents due to the charge of capacitors $C_{i,j}$ are considered. Further, the propagation delay in amplifiers $Q_{i,j}$ has been neglected. The operation of circuit 48 will now be detailed for clock cycle $P_0$. At time $t'_0$, a rising edge of clock signal CLK reaches amplifier $Q_{0,0}$ and $Q_{0,1}$. Since control signals $S_{0,0}$ and $S_{0,1}$ are at "0", the associated capacitors $C_{0,0}$ and $C_{0,1}$ are not charged and the surge current is zero. At time $t'_1$, the rising edge of the clock signal reaches amplifiers $Q_{1,0}$ and $Q_{1,1}$. Since signal $S_{1,0}$ is at "1" and signal $S5_{1,1}$ is at "0", only capacitor $C_{1,1}$ charges, which corresponds to a surge current $I_1$. At time $t'_2$, the rising edge of clock signal CLK reaches amplifiers $Q_{2,0}$ and $Q_{2,1}$. Since control signals $S_{2,0}$ and $S_{2,1}$ both are at "1", capacitors $C_{2,0}$ and $C_{2,1}$ charge, which corresponds to a greater surge current $I_2$. At time $t'_3$, the rising edge of clock signal CLK reaches amplifiers $Q_{3,0}$ and $Q_{3,1}$. Control signals $S_{3,0}$ and $S_{3,1}$ being at "0", capacitors $C_{3,0}$ and $C_{3,1}$ are not charged and the surge current is zero.

More specifically, when a rising edge of clock signal CLK reaches a capacitor $C_{i,j}$, a fast rise of the surge current followed by a fast decrease of the surge current can be observed. Thereby, to obtain a "smooth" curve of surge current $I_{rep}$, the charges of capacitors $C_{i,j}$ and $C_{i+1,j}$ must not be too distant from each other, that is, M must be sufficiently large. In this case, when a rising edge of clock signal CLK reaches a capacitor $C_{i,j}$ and, after a given delay, a capacitor $C_{i+1,j}$, the current surge due to the charge of capacitor $C_{i,j}$ is not over when the current surge due to the charge of capacitor $C_{i+1,j}$ starts. Thereby, to obtain a surge current of determined intensity at a given time, the number of capacitors to be charged at this given time is determined by taking into account the number of capacitors having started being charged at the times preceding the given time and which may still be under charge.

The surge current which results from the operation of emulator 22 is essentially due to the charge and to the discharge of capacitors $C_{i,j}$. However, processing unit 50 may, on determination of control signals $S_{i,j}$, take into account the contribution of surge current $I_{rep}$ of the other components of emulator 22.

The previously-described embodiment relates to an emulator 22 of a test device 20 of an analog circuit 12 for a digital/analog circuit 10 powered by a single power supply field $Uref_D$ and rated by a single clock signal CLK. However, the present invention may apply to the testing of an analog circuit intended to equip a combined circuit powered by several different power supply sources and rated by several different clock signals.

Figure 13:
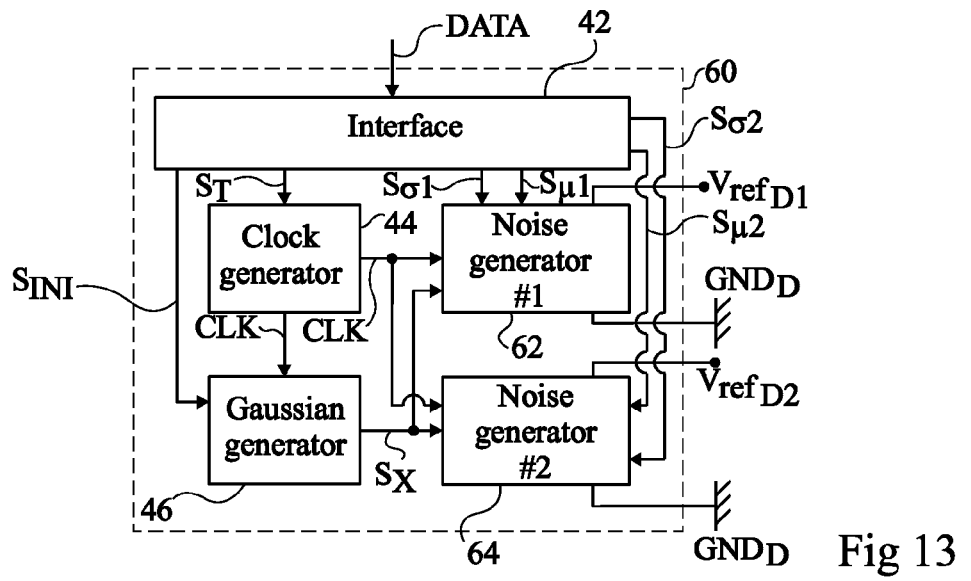
FIGS. 13 and 14 show variations of the emulator of FIG. 7.

FIG. 13 shows in the form of a block diagram an emulator 60 which corresponds to a variation of emulator 22 adapted to the case where the combined circuit comprises a first digital circuit portion powered by a first supply field and a second digital circuit portion powered by a second supply field. Emulator 60 comprises two noise generation circuits 62, 64, each receiving clock signal CLK and signal $S_X$. Interface circuit 42 provides first noise generation circuit 62 with signals $S_{\mu 1}$ and $S_{o1}$ representative of the average and of the standard deviation $\mu_{I1}$ and $\sigma_{I1}$ of the surge current due to the portion of the digital circuit connected to a potential $Vref_{D1}$. Interface circuit 42 provides second noise generation circuit 64 with signals $S_{\mu 2}$ and $S_{o2}$ representative of the average and of the standard deviation $\mu_{I2}$ and $\sigma_{I2}$ of the surge current due to the portion of the digital circuit connected to a potential $Vref_{D2}$. The operation of each noise generation circuit 62, 64 may be identical to what has been previously described for noise generation circuit 48.

Figure 14:
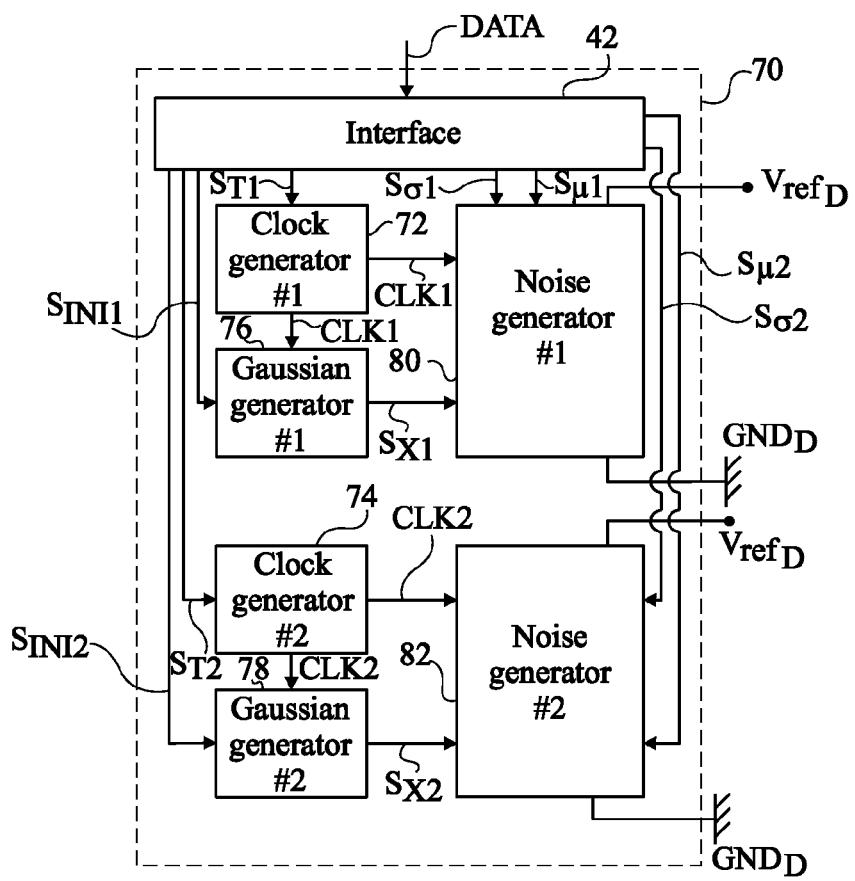

FIG. 14 shows an emulator 70 which corresponds to a variation of emulator 22 adapted to the case where the combined circuit comprises a first digital circuit portion rated by a first clock signal $CLK_1$ and a second digital circuit portion rated by a second clock signal $CLK_2$. Interface circuit 42 is capable of providing a first period reference $S_{T1}$ to a first circuit 72 for providing clock signal $CLK_1$ and a second clock period reference $S_{T2}$ to a second circuit 74 for providing clock signal $CLK_2$. Interface circuit 42 provides a first noise generation circuit 80 with signals $S_{\mu 1}$ and $S_{o1}$ representative of the average and of the standard deviation $\mu_{I1}$ and $\sigma_{I1}$ of the surge current due to the portion of the digital circuit rated by clock signal $CLK_1$. Interface circuit 42 provides a second noise generation circuit 82 with signals $S_{\mu 2}$ and $S_{o2}$ representative of the average and of the standard deviation $\mu_{I2}$ and $\sigma_{I2}$ of the surge current due to the portion of the digital circuit rated by clock signal $CLK_2$. A first circuit 76 provides a pseudo-random signal $S_{X1}$ to circuit 80 and a second circuit 78 provides a second pseudo-random signal $S_{X2}$ to second noise generation circuit 82.

The present invention enables to form a device 20 for testing a particularly simple analog circuit 12. Indeed, emulator 22 has a much simpler structure than that of digital circuit 14 while reproducing the noise of power supply voltage $Uref_A$ due to the operation of digital circuit 14. The present invention thus enables to test analog circuit 12 and, in particular, to determine the performance decreases of analog circuit 12 when power supply voltage $Uref_A$ of analog circuit 12 is corrupted with noise. Based on the obtained results, several actions may be envisaged to limit the performance decrease of analog circuit 12. As an example, a better isolation between the digital and analog circuits may be provided. Further, the operating frequency range of combined circuit 10 may be narrowed. Digital circuit 14 may also be modified to better distribute the current surge peaks, for example, to spread them in time.

Emulator 22 according to the invention further provides a great flexibility of use since data DATA provided to emulator 22 are representative of the standard deviation and average curves over a clock cycle or several successive clock cycles and thus have a low bulk.

Further, a same emulator 22 may be used to reproduce the noise of power supply voltage $Uref_A$ which would be due to different types of digital circuit 14. Indeed, it is sufficient for this purpose to modify the values of average $\mu_I$ and of standard deviation $\sigma_I$ provided to interface circuit 42. The complexity of the noise likely to be reproduced by a same emulator depends on number M of branches of the last stage of noise generation circuit 48 and on number L of capacitors per branch of the last stage of noise generation circuit 48.

Although a method for testing an analog circuit has been described, it should be clear that the test method may be implemented by software means to test an analog circuit simulation. In this case, the method implements a software simulation of emulator 22 which is used with a software simulation of analog circuit 12. The implementation of the test method is identical to what has been previously described, the electronic circuit elements being replaced with software elements.

Of course, the present invention is likely to have various alterations and modifications which will occur to those skilled in the art. In particular, any circuit capable of causing a current surge may be used instead of each capacitor $C_{i,j}$ of noise generation circuit 48 or at least of some of them. As an example, each capacitor $C_{i,j}$ may be replaced with a circuit comprising one or several MOS transistors. Further, although embodiments in which the digital/analog circuit comprises an analog circuit and a digital circuit connected to separate power supplies have been described, it should be clear that the present invention also applies to a digital/analog circuit in which the analog circuit and the digital circuit are connected to a single power supply likely to be corrupted with noise during the operation of the digital circuit.

The invention claimed is:

1. A device (20) for testing an analog circuit (12), for a combined circuit (10) comprising this analog circuit and a synchronous digital circuit (14), said test device comprising a noise emulator (22) connected to a first power supply source ($Uref_D$) capable of disturbing a second power supply source ($Uref_A$) of the analog circuit, where the first and second power supply sources may be a single supply source, the emulator being capable of receiving data representative of a variation curve, over a given time period, of an average ($\mu_I$) and of a standard deviation ($\sigma_I$) of a first surge current (I) which would be applied to the first power supply source by the digital circuit, and being capable of applying to the first power supply source, over successive intervals, each successive interval having a duration of said time period, a second surge current ($I_{rep}$) equal to:

$$I_{rep}(t)=\mu_I(t[T])+\sigma_I(t[T])*X(t)$$

where t[T] is t modulo T and X is a random function obeying a normal distribution and obtained from a pseudo-random signal.

2. The device of claim 1, comprising:
at least one circuit (46) for providing the pseudo-random signal ($S_X$) capable of providing a new value of the pseudo-random signal for each successive interval; and
a noise generation circuit (48) capable of applying the second surge current ($I_{rep}$) to the first power supply source ($Uref_D$).

3. The device of claim 2, wherein the noise generation circuit (48) comprises:
a processing unit (50) receiving the pseudo-random signal ($S_X$) and the representative data and providing control signals ($S_{i,j}$); and
noise elements ($Q_{i,j}$, $C_{i,j}$), each noise element being connected to the first power supply source ($Uref_D$) and being capable of being controlled by one of the control signals to provide an elementary surge current.

4. The device of claim 3, wherein the noise generation circuit (48) comprises:
a first stage comprising a transmission element (R) receiving a clock signal (CLK);
second successive stages, each comprising several groups of at least one transmission element (R'), the input of said at least one transmission element of each group being connected to the output of the transmission element or of one of the transmission elements of the previous stage; and
a last stage comprising a first plurality of transmission elements ($R_i$), the input of each of the first plurality of transmission elements being connected to one of the transmission elements of the previous stage and the output of each of the first plurality of transmission elements being connected to a second plurality of noise elements ($Q_{i,j}$, $C_{i,j}$).

5. The device of claim 4, wherein each noise element ($Q_{i,j}$, $C_{i,j}$) comprises a switching element ($Q_{i,j}$), receiving one of the control signals ($S_{i,j}$), in series with a capacitor ($C_{i,j}$), the switching element being capable of being on or off according to the control signal.

6. The device of claim 4, wherein each of the first plurality of transmission elements ($R_i$) has a transmission duration which depends on the transmission element.

7. The device of claim 2, further comprising a circuit (44) for providing a clock signal (CLK) to the circuit (46) for providing the pseudo-random signal ($S_X$) and to the noise generation circuit (48).

8. A method for testing an analog circuit (12) for a combined circuit (10) comprising this analog circuit and a synchronous digital circuit (14), comprising the steps of:
providing a test device (20) or a test device simulation comprising or simulating the analog circuit and a noise emulator (22) connected to a first power supply source ($Uref_D$) capable of disturbing a second power supply source ($Uref_A$) of the analog circuit, where first and second power supply sources may be a single supply source;
providing the emulator with data representative of a variation curve, over a given time period, of an average ($\mu_I$) and of a standard deviation ($\sigma_I$) of a first surge current (I) which would be applied to the first power supply source by the digital circuit; and
having the emulator apply or simulate application to the first power supply source, over successive intervals, each interval having a duration of said time period, a second surge current ($I_{rep}$) equal to:

$$I_{rep}(t)=\mu_I(t[T])+\sigma_I(t[T])*X(t)$$

where t[T] is t modulo T and X is a random function obeying a normal distribution and obtained from a pseudo-random signal.

9. The method of claim 8, wherein the provision of said representative data comprises the steps of:
estimating the variation curve of the first surge current (I) over several successive intervals each having said duration; and
determining, for each first time among first successive times of an interval having said duration, the average of the values of the first surge current at second times, each second time being equal to the first time modulo said duration, and the standard deviation of the values of the first surge current at said second times.

* * * * *